(12) United States Patent
Zarubinsky et al.

(10) Patent No.: US 6,313,774 B1
(45) Date of Patent: Nov. 6, 2001

(54) DELTA-SIGMA ANALOG-TO-DIGITAL CONVERTER, AND METHOD

(75) Inventors: Michael Zarubinsky, Jerusalem; Yachin Afek, Cfarsabe, both of (IL)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/574,022

(22) Filed: May 19, 2000

(51) Int. Cl.$^7$ ..................................................... H03M 3/00

(52) U.S. Cl. ........................................... 341/143; 341/155

(58) Field of Search ..................................... 341/143, 155

(56) References Cited

U.S. PATENT DOCUMENTS

| | | | |
|---|---|---|---|
| 4,536,880 | * 8/1985 | Grallert | 375/30 |
| 4,772,871 | * 9/1988 | Suzuki et al. | 341/155 |
| 5,790,063 | 8/1998 | Koifman et al. | 341/155 |
| 5,889,482 | 3/1999 | Zarubinsky et al. | 341/131 |
| 5,903,232 | 5/1999 | Zarubinsky et al. | 341/61 |
| 6,218,973 | * 4/2001 | Barrett, Jr. et al. | 341/143 |

OTHER PUBLICATIONS

Temes, G.C: "Delta–Sigma Data Converters", chapter 10 on pp. 317–339 of the following: "Franca, J.E., Tsividis, Y. (editors): 'Design of Analog–Digital VLSI Circuits for Telecommunications and Signal Processing', Second Edition, Prentice Hall, Englewood Cliffs, 1994, ISBN 0-13-203639-8".

Carley, R.L., Schreier R., Temes, G.C.: "Delta–Signal ADCs with Multibit Internal Converters", chapter 8 on pp. 244–281 of the following: "Norsworthy, S. R., Schrier, R., Temes, G. C. (editors): 'Delta–Sigma Data Converters', IEEE Press, New York, 1997, ISBN 0–7803–1045–4".

Proakis, J. G., Manolakis, D. G.: "Digital Signal Processing", Third Edition, Prentice Hall, Englewood Cliffs, 1996, ISBN 0–13–373–762–4, chapter 9.2. "Analog–to–Digital Conversion", on pp. 748–762.

Proakis, J. G., Manolakis, D. G.: "Digital Signal Processing", Third Edition, Prentice Hall, Englewood Cliffs, 1996, chapter 3.1. "Z–Transform", on pp. 151–160.

* cited by examiner

Primary Examiner—Peguy Jeanpierre

(57) ABSTRACT

An analog-to-digital converter (200) has a first stage (207) to integrate and quantize the difference between a feedback signal (R) and an input signal (X) to a first intermediate signal ($Y_1$) with a first resolution ($M_1$), a second stage (208) to integrate and quantize the first intermediate signal ($Y_1$) to a second intermediate signal ($Y_2$) with a second, lower resolution ($M_2$), a feedback stage (260) to convert the second intermediate signal ($Y_2$) to the feedback signal (R), and a third stage (206, 270, 280, 285) to differentiate the first intermediate signal ($Y_1$) to a third intermediate signal ($W_1$), to delay the second intermediate signal ($Y_2$) to a fourth intermediate signal ($W_2$), and to add the third and fourth intermediate signals ($W_1, W_2$) to an output signal (Y) having a resolution that results from the sum of the first ($M_1$) and second ($M_2$) resolutions.

15 Claims, 3 Drawing Sheets

DELTA-SIGMA ANALOG-TO-DIGITAL CONVERTER, AND METHOD

FIELD OF THE INVENTION

The present invention relates to data converters and, in particular, relates to an analog-to-digital converter (ADC) with delta-sigma modulation.

BACKGROUND OF THE INVENTION

By modern electronics, useful information (for example voice, measurement data, music, control commands, etc.) is transmitted, processed or otherwise manipulated by signals in analog (A) form or digital (D) form. Signal conversion between analog (A) and digital (D) signals in both directions is thereby often required. The quality of analog-to-digital converters (ADC) and digital-to-analog converters (DAC) and other electronic circuits can be expressed by, for example, a signal-to-noise ratio (SNR) indicating how useful signals are separated from unwanted signals.

Sigma-delta modulators serving as analog-to digital converters are well known in the art and had been described in a variety of publications. They are also known under the term "delta-sigma modulators".

For the application of sigma-delta modulators and for prior art designs, the following references are useful: (REF 1) Temes, G. C: "Delta-Sigma Data Converters", chapter 10 on pages 317–339 of the following: "Franca, J. E., Tsividis, Y. (editors): 'Design of Analog-Digital VLSI Circuits for Telecommunications and Signal Processing', Second Edition, Prentice Hall, Englewood Cliffs, 1994, ISBN 0-13-203639-8"; (REF 2) Carley, R. L., Schreier R., Temes, G. C.: "Delta-Signal ADCs with Multibit Internal Converters", chapter 8 on pages 244–281 of the following: "Norsworthy, S. R., Schreier, R., Temes, G. C. (editors): 'Delta-Sigma Data Converters', IEEE Press, New York, 1997, ISBN 0-7803-1045-4"; and (REF 3) Proakis, J. G., Manolakis, D. G. : "Digital Signal Processing", Third Edition, Prentice Hall, Englewood Cliffs, 1996, ISBN 0-13-373-762-4, chapter 9.2. "Analog-to-Digital Conversion", on pages 748–762, and chapter 3.1. "Z-Transform", on pages 151–160.

FIG. 1 illustrates a simplified block diagram of prior art delta-sigma converter 100 providing a multilevel digital output signal Y. Converter 100 comprises adder 105, analog integrator 110, multibit quantizer 120 (i.e. ADC), and multibit digital-to-analog converter 130 (DAC). Adder 105 receives input signal X from analog input 101; quantizer 120 provides multilevel digital output signal Y (e.g., $2^M$ different magnitude levels) to digital output 102; DAC 130 feeds back Y via feedback lines 121 (e.g., M bit) and 131 (analog) to adder 105. The feedback forces the average value of signal Y to track the average signal X. Any difference between X and Y accumulates in integrator 110 and eventually corrects itself. However, the linearity of DAC 130 limits the linearity of the complete converter 100.

FIG. 2 illustrates a simplified time diagram of digital output signal Y of the converter of FIG. 1 for an assumed ramping input signal X. Conveniently, FIG. 2 also illustrates sampling time intervals $T_S$. In the example, Y has a M=3 bit resolution with magnitude levels "000" for level 0, "001" for level 1, "010" for level 2, "011" for level 3, etc.

Signal X has a maximum frequency of F. Quantizer 120 operates at sampling frequency $F_S$ (signal from input 103, $F_S=1/T_S$) that is, preferably, an oversampling frequency in respect to F. The quantization noise introduced by quantizer 120 has a first order shape. The signal noise ratio of the output signal is estimated as follows:

$$SNR = k*(F/F_S)^{-1.5}*(2^M-1) \qquad (1)$$

where k is a constant factor. The SNR can be improved by increasing M, i.e. having a higher bit resolution in quantizer 120 and DAC 130. However, this is not desirable due to higher manufacturing costs.

DETAILED DESCRIPTION OF A PREFERRED EMBODIMENT

Figure 2:
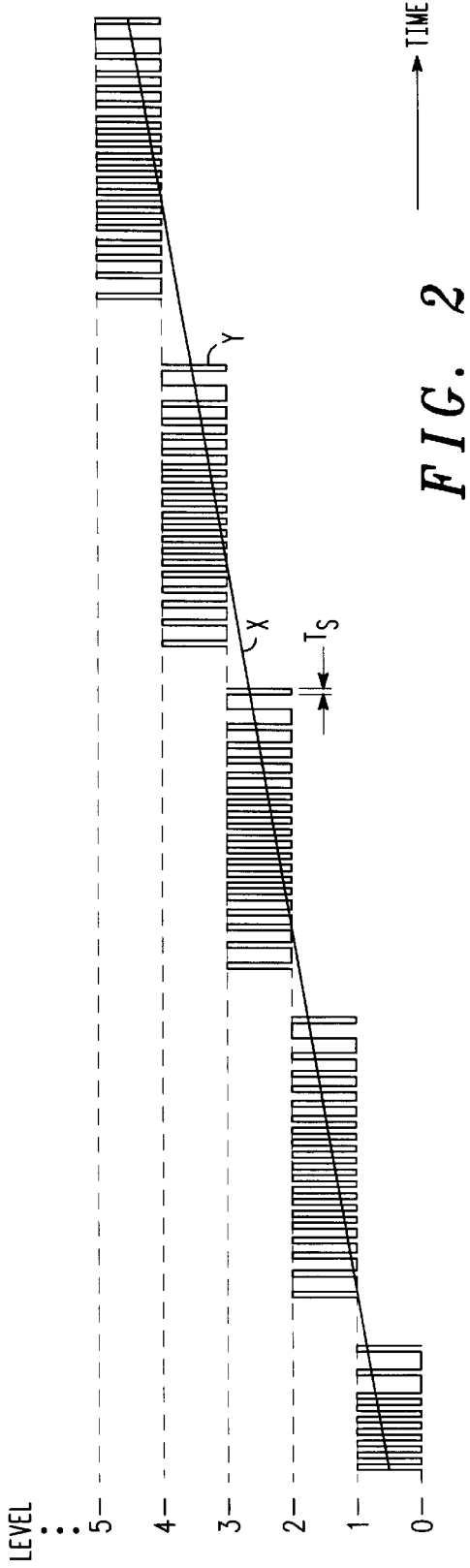
FIG. 2 illustrates a simplified time diagram of the digital output signal of the converter of FIG. 1 for an assumed ramping input signal.

Unless specified otherwise, digital signals (such as $Y_1, Y_2, W_1, W_2, Y, Q_1, Q_2$) have a sampling rate $F_S$ that corresponds to the sampling time interval $T_S=1/F_S$ (cf. FIG. 2). For the convenience of explanation, transfer functions of functional blocks are indicated by well-known Z-operators described, for example, in reference (REF 3). In block diagrams, arrows → on the lines indicate a preferred signal flow direction. Bold lines are multibit lines for digital signals with $M_1$ or $M_2$ bit. Preferably, the multibit lines carry the bits in parallel.

A person of skill in the art is able, based on the description herein, to implement the present invention by, for example, active and passive electronic components (e.g., transistors, connections or the like). Such persons are also able to provide power supplies, reference signals, clock signals (e.g., at $F_S$) and others which are not shown for simplicity.

Figure 3:
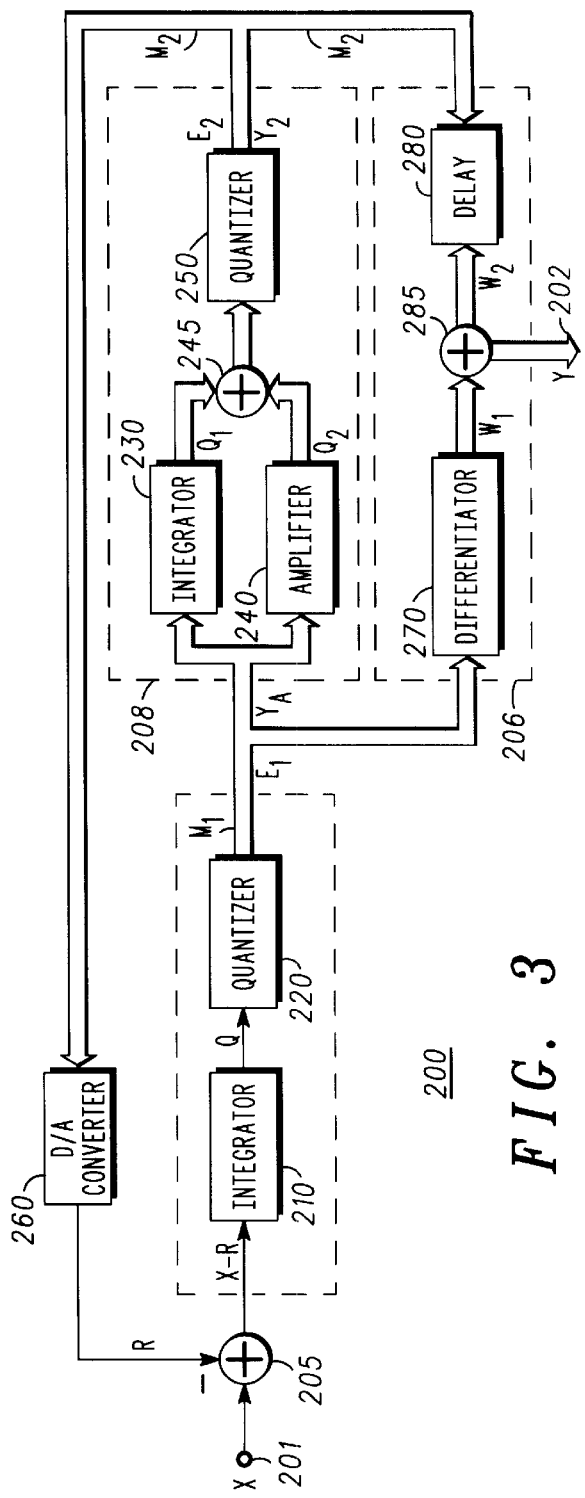
FIG. 3 illustrates a simplified block diagram of a delta-sigma analog-to-digital converter according to the present invention.
Figure 5:
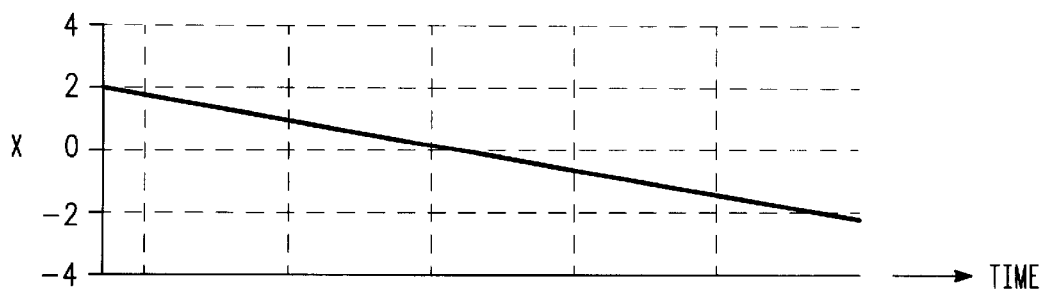
FIGS. 5–8 illustrate simplified time diagrams of the input signal (FIG. 5), a first digital intermediate signal (FIG. 6), a second digital intermediate signal (FIG. 7), and the digital output signal (FIG. 8) of the converter of FIG. 4.

FIG. 3 illustrates a simplified block diagram of delta-sigma analog-to-digital converter 200 according to the present invention. Converter 200 converts analog input signal X at input 201 to digital output signal Y at output 202. As illustrated in FIG. 3, converter 200 preferably comprises adder 205, analog integrator 210, first quantizer 220, digital integrator 230, amplifier 240, adder 245, second quantizer 250, digital-to-analog converter (DAC) 260, digital differentiator 270, delay unit 280, and adder 285.

Adder 205 sends the difference X-R between analog input signal X and analog feedback signal R to integrator 210. Integrator 210 integrates X-R to signal Q. Quantizer 220 outputs first digital intermediate signal $Y'_1$ having a resolution of $M_1$ bit (e.g., $2^{M1}$ magnitude levels). Considering quantization noise $E_1$ (i.e. an "error signal"), the first intermediate signal is written as $Y_1=Y'_1+E_1$. Integrator 230 integrates signal $Y_1$ to signal $Q_1$, for example, by providing an accumulation of $Y_1$. Amplifier 240 amplifies signal $Y_1$ with a gain G to signal $Q_2$ (e.g., G≈2). Adder 245 forwards the sum $Q_1+Q_2$ to second quantizer 250. Quantizer 250 quantizes $Q_1+Q_2$ to second digital intermediate signal $Y'_2$ having a resolution of $M_2$ bit ($2^{M_2}$ magnitude levels). Again considering quantization by adding noise $E_2$, the second intermediate signal is written as $Y_2=Y'_2+E_2$.

Preferably, quantizer 220 is implemented by a flash converter. Quantizer 220 uses convenient values for bit resolution $M_1$ between $$2 \leq M_1 \leq 8 \quad (2)$$

and provides $Y_1$ in a first signal range with a maximum $Y_1$ $_{MAX}$ and a minimum $Y_1$ $_{MIN}$. For convenience of explanation, it is assumed that the maximum $Y_1$ $_{MAX}$ is represented by all $M_1$ bits being "1", i.e. the numerical value of $2^{M_1}-1$; and the minimum $Y_1$ $_{MIN}$ is represented by all bits being "0", i.e. the numerical value zero. A quantization step $\Delta Y_1$ of quantizer 220 is estimated as $$\Delta Y_1 = (Y_{1\ MAX} - Y_{1\ MIN})/(2^{M_1}-1)$$

$$= Y_{1\ MAX}/(2^{M_1}) \quad (3)$$

($2^{M_1}-1$) is the number of steps. In other words, adjacent levels of $Y_1$ are spaced by $\Delta Y_1$. A definition of maximum and minimum values having equal amount but different sign (i.e., $Y_{1\ MAX} = -Y_{1\ MIN}$) is also convenient.

Quantizer 250 uses convenient values for bit resolution $M_2$ between $$2 \leq M_2 \leq 8 \quad (4)$$

and provides $Y_2$ in a second signal range having a maximum $Y_2$ $_{MAX}$ and a minimum $Y_2$ $_{MIN}$. Quantization step $\Delta Y_2$ for signal $Y_2$ is defined accordingly.

Preferably, first and second signal ranges are related according to $$Y_{1\ MAX} - Y_{1\ MIN} = p * \frac{Y_{2\ MAX} - Y_{2\ MIN}}{2^{M_2}-1} \quad (5)$$

wherein, preferably, real factor p is larger than or equal to 1 or smaller than or equal to 4 ($1 \leq p \leq 4$). A preferred value for p is p $\approx 2$. In other words, the signal ranges relate to each other proportionally, wherein the number of steps ($2^{M_2}1$) of quantizer 250 participates in the proportional factor between the ranges. Preferably, the first signal range ($Y_{1\ MAX}-Y_{1\ MIN}$) is smaller than the second signal range ($Y_{2\ MAX}-Y_{2\ MIN}$) but larger than the second quantization step $\Delta Y_2$.

Preferably, the signal ranges and bit resolutions are selected such that the quantization steps are different $\Delta Y_1 \neq \Delta Y_2$, preferably, $\Delta Y_1 < \Delta Y_2$. In other words, quantizer 220 provides a fine quantization and quantizer 250 provides a rough quantization.

Analog integrator 210 has the following equivalent transfer function:

$$H_1 = \frac{Z^{-1}}{1 - Z^{-1}} \quad (6)$$

Using digital terminology is convenient; transferring into the z-area is well known.

Digital integrator 230, amplifier 240 and adder 245 have the following transfer function:

$$H_2 = \frac{G + (1-G)*Z^{-1}}{1 - Z^{-1}} \quad (7)$$

DAC 260 feeds back signal $Y_2$ that is – in analog form as signal R– subtracted from input signal X by adder 205. DAC 260 has a similar $M_2$ bit resolution as quantizer 250.

Digital module 206 (dashed frame) with differentiator 270, adder 285 and delay unit 280 combines intermediate signals $Y_1$ and $Y_2$ to output signal Y. Preferably, differentiator 270 differentiates signal $Y_1$ to signal $W_1$ by the following transfer function:

$$W_1 = Y_1 * H_3 * Z^{-N} \quad (8)$$

where $Z^{-N}$ indicates a delay by N sample time intervals $T_S$ ($T_S=1/F_S$). $H_3$ stands for the inverse of the integrating function $H_1$ of integrator 210 (cf. FIG. 4), that is $$H_3 = 1/H_1 \quad (9).$$

Delay unit 280 delays signal $Y_2$ by N sample time intervals $T_S$ to $W_2$, that is $$W_2 = Y_2 * Z^{-N} \quad (10)$$

Adder combines $W_1$ and $W_2$ to output signal Y, that is $$Y = W_1 + W_2 \quad (11)$$

It is an important advantage of the present invention that the resolution of output signal Y substantially corresponds to the sum of the resolutions of quantizers 220 and 250 (i.e. $M_1+M_2-1$). This allows to simplify the design of each quantizer in comparison to the prior art.

In the following, the SNR of Y in converter 200 according to the present invention is estimated and compared to the prior art solution in converter 100. For convenience, integrator 210 and quantizer 220 are referred to as first stage 207 (dashed frame); and integrator 230, amplifier 240, quantizer 250 are referred to as second stage 208 (dashed frame).

Figure 1:
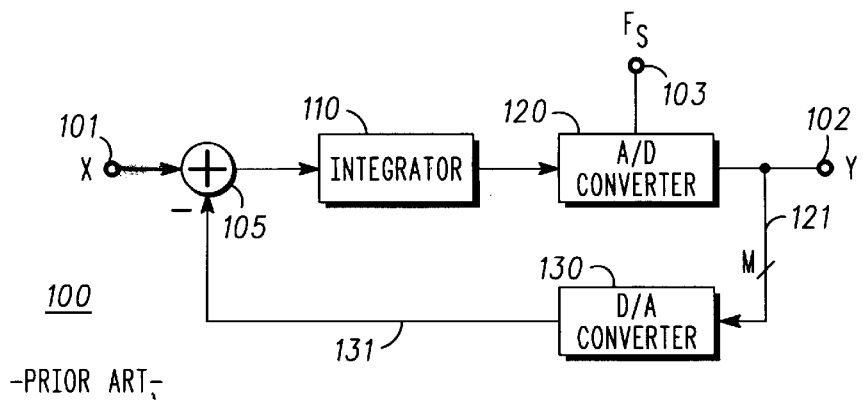
FIG. 1 illustrates a simplified block diagram of a prior art delta-sigma converter having a multilevel digital output signal.
Figure 4:
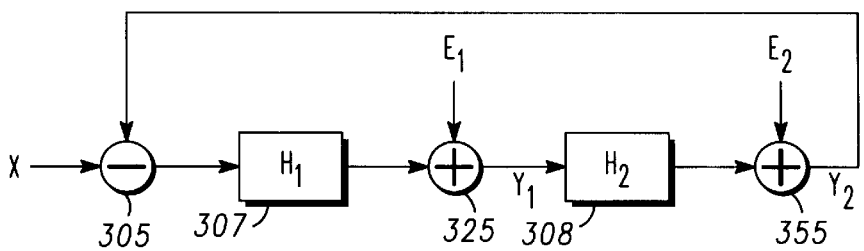
FIG. 4 illustrates a simplified transfer function diagram of the converter of FIG. 3.

FIG. 4 illustrates a simplified transfer function diagram ("equivalent circuit") of the converter of FIG. 3. In FIG. 4, square 307 symbolizes the transfer function $H_1$ of stage 207 (cf. FIG. 3); square 308 symbolizes the transfer function $H_2$ of stage 208 (cf. FIG. 3); the minus symbol 305 symbolizes that intermediate signal $Y_2$ is subtracted from input signal X; and the plus symbol 325, 355 symbolize the introduction of quantization noise $E_1$ and $E_2$, respectively, as described above. For simplicity, the transfer functions of quantizers 220 and 250 are considered as being 1, so that $H_1$ and $H_2$ are substantially provided by integrator 210 and integrator 230/amplifier 240, respectively, as explained above in connection with equations (6) and (7).

Intermediate signal $Y_1$ comprises the application of transfer function $H_1$ to input signal X (first term), the negative application of transfer function $H_1$ to intermediate signal $Y_2$ as feedback (second term), and noise $E_1$ (third term), that is:

$$Y_1 = H_1 * X - H_1 * Y_2 + E_1 \quad (12)$$

Intermediate signal $Y_2$ comprises the application of transfer function $H_2$ to intermediate signal $Y_1$ and noise $E_2$, that is:

$$Y_2 = H_2 * Y_1 + E_2 \quad (13)$$

Intermediate signal $Y_2$ can be obtained by inserting $Y_1$ of equation (12) into equation (13), that is:

$$Y_2 H_2 * [H_1 * X - H_1 * Y_2 + E_1] + E_2 \quad (14)$$

$$Y_2 = H_1 * H_2 * X - H_1 * H_2 * Y_2 + H_2 * E_1 + E_2 \quad (15)$$

$$Y_2 * (1 + H_1 * H_2) = H_1 * H_2 * X + H_2 * E_1 + E_2 \quad (16)$$

$$Y_2 = \frac{1}{(1 + H_1 * H_2)} * [H_1 * H_2 * X + E_1 * H_2 + E_2] \quad (17)$$

Intermediate signal $Y_1$ can be calculated by inserting $Y_2$ into equation (12), that is:

$$Y_1 = \frac{1}{(1 + H_1 * H_2)} * [H_1 * X * (1 + H_1 * H_2) - \\ H_1 * H_1 * H_2 * X + H_1 * H_2 * E_1 + H_1 * E_2 + \\ E_1 * (1 + H_1 * H_2)] \quad (18)$$

$$Y_1 = \frac{1}{(1 + H_1 * H_2)} * [H_1 * X - H_1 * E_2 + E_1] \quad (19)$$

Further, considering the functions of differentiator 270, delay unit 280 and adder 285 (cf. module 206 in FIG. 3, not illustrated in FIG. 4), the output signal Y is estimated as follows:

$$Y = \frac{Y_1 * z^{-N}}{H_1} + Y_2 * z^{-N} \quad (20)$$

$$Y = \frac{z^{-N}}{(1 + H_1 * H_2)} * [H_1 * X / H_1 - H_1 * E_2 / H_1 + E_1 / H_1 + \\ H_1 * H_2 * X + E_1 * H_2 + E_2] \quad (21)$$

$$Y = \frac{z^{-N}}{(1 + H_1 * H_2)} * [X + E_1 / H_1 + H_1 * H_2 * X + E_1 * H_2] \quad (22)$$

$$Y = \frac{z^{-N}}{(1 + H_1 * H_2)} * [X * (1 + H_1 * H_2) + \\ (E_1 / H_1) * (1 + H_1 * H_2)] \quad (23)$$

$$Y = z^{-N} * [X + E_1 / H_1] \quad (24)$$

Conveniently, taken N=1, equation (24) is simplified to $$Y = Z^{-1} * X + E_1 * (1 - Z^1) \quad (25)$$

Thus, converter 200 provides first-order noise shaping similar to converter 100 of the prior art. The SNR is estimated as $$SNR = k * (F/F_S)^{-1.5} * (2^{M1+M2-1} - 1) \quad (26)$$

In comparison to converter 100 (cf. equation (1)), the present invention allows to achieve the same SNR by splitting the resolution M into first $M_1 < M$ and second $M_2 < M$ resolutions of first (220) and second (250) quantizers, respectively. Implementing low resolution quantizers is cost saving. This advantage can also be used to provide converter 200 having a higher SNR than prior art converter 100. In other words, the numbers of magnitude levels ($2^{M1}$, $2^{M2}$) of each quantizer substantially add to each other to an overall number of magnitude levels (i.e., resolution) of analog-to-digital converter 200.

FIGS. 5–8 illustrate simplified time diagrams of input signal X (FIG. 5), first digital intermediate signal $Y_1$ (FIG. 6), second digital intermediate signal $Y_2$ (FIG. 7), and digital output signal Y (FIG. 8) of converter 200 by way of example. FIGS. 5–8 share a common time axis with sampling time intervals $T_S$ (cf. FIG. 6).

The magnitude of input signal X continuously decreases from +2 to −2. Intermediate signal $Y_1$ assumes magnitudes between $Y_{1\,MAX}=0.75$ and $Y_{1\,MIN}=-1$ spaced by step $\Delta Y_1 = 0.25$ (cf. equation (3), $M_1=3$). In other words, $Y_1$ has a first plurality of magnitude levels: 0.75, 0.5, 0.25, 0, −0.25, −0.5, −0.75, and −1. Intermediate signal $Y_2$ assumes magnitudes between $Y_{2\,MAX}=3$ and $Y_{2\,MIN}=-4$ spaced by $\Delta Y_2=1$ ($M_2=3$). As mentioned above, $\Delta Y_2$ is different from $\Delta Y_1$; here $\Delta Y_2 > \Delta Y_1$. In other words, $Y_2$ has a second plurality of magnitude levels: 3, 2, 1, 0, −1, −2, −3, and −4.

Output signal Y follows input signal X. As mentioned above, the combination of $Y_1$ and $Y_2$ to Y substantially adds the magnitudes of $Y_1$ and $Y_2$ so that the overall accuracy expressed by the number of magnitude levels of Y is higher than for $Y_1$ and $Y_2$.

Figure 9:
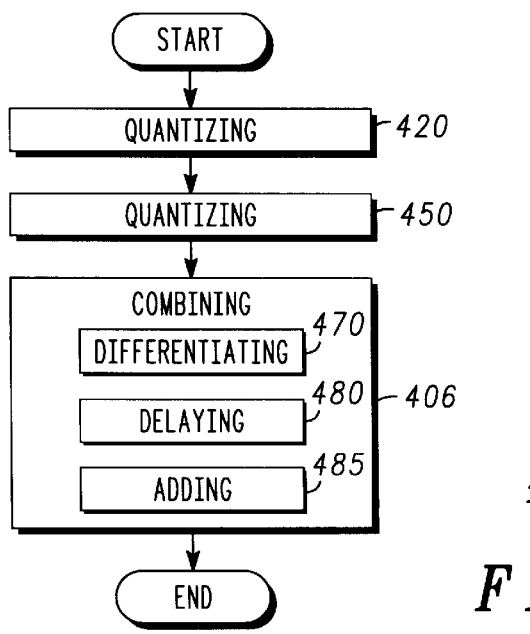
FIG. 9 illustrates a simplified method flow chart diagram of a method for converting an analog signal to a digital signal according to the present invention.

FIG. 9 illustrates a simplified method flow chart diagram of method 400 for converting analog signal X to digital signal Y according to the present invention. In FIGS. 9 and 3, reference numbers 420/220, 450/250, 406/206, 470/270, 480/280 and 485/285 stand for method steps and corresponding elements that perform these steps in the embodiment illustrated.

Figure 6:
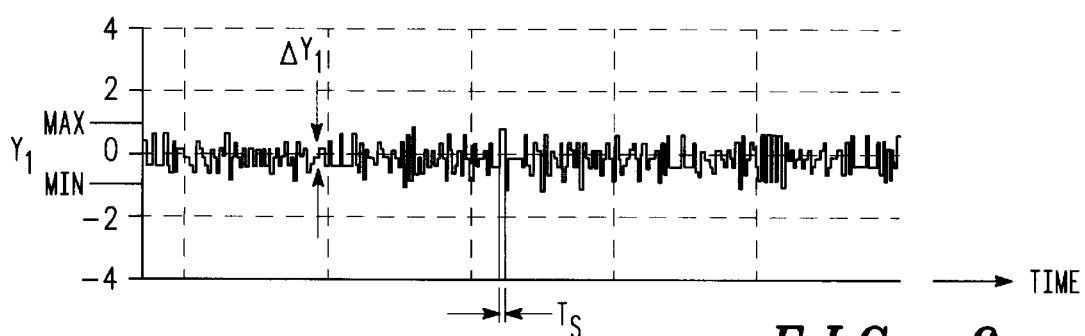

In first quantizing step 420, a first integral of the difference between feedback signal R and input signal X is quantized to first intermediate digital signal $Y_1$ that has a first plurality of magnitude levels (cf. FIG. 6).

Figure 7:
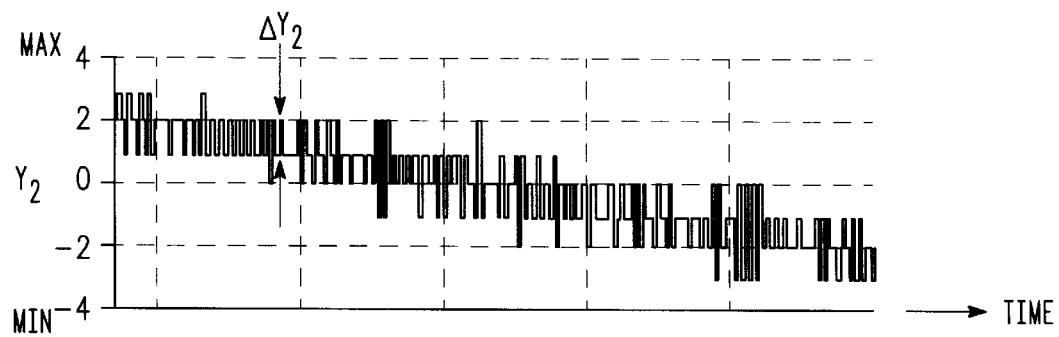

In second quantizing step 450, a second integral $Q_1 + Q_2$ of first intermediate digital signal $Y_1$ is quantized to second intermediate digital signal $Y_2$ that has a second plurality of magnitude levels (cf. FIG. 7).

Figure 8:
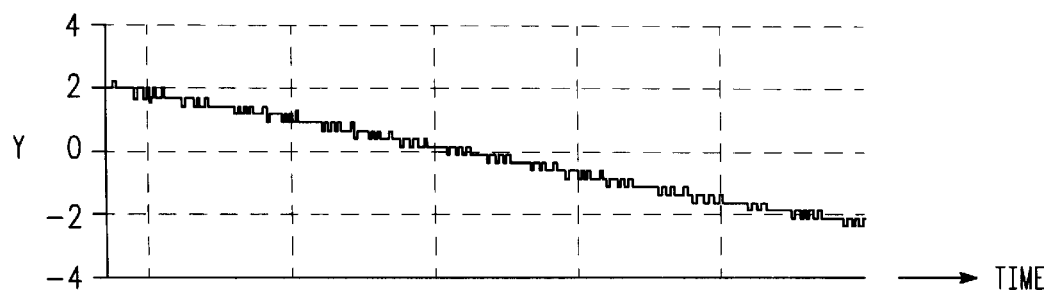

In combining step 406, intermediate digital signals $Y_1$ and $Y_2$ are combined to output signal Y so that the first and second pluralities of magnitude levels substantially add to an overall plurality of magnitude levels of the output signal Y (cf. FIG. 8).

Preferably, combining step 406 comprises the following sub-steps: differentiating 470 first intermediate signal $Y_1$ to third intermediate signal $W_1$, delaying 480 second intermediate signal $Y_2$ to fourth intermediate signal $W_2$, and adding 485 third intermediate signal $W_1$ and fourth intermediate signal $W_2$ to digital output signal Y.

Preferably, in differentiating step 470, $Y_1$ is differentiated by transfer function $H_3$ that is inverse to the transfer function $H_1$ by which first integral is obtained in quantizing step 420 (cf. equation (9)).

Preferably, in quantizing step 420, adjacent magnitude levels of $Y_1$ are spaced by quantization step $\Delta Y_1$, in quantizing step 450, adjacent magnitude levels of $Y_2$ are spaced by quantization step $\Delta Y_2$ that is different from quantization step $\Delta Y_1$ (cf. equation (5), e.g., $\Delta Y_1 < \Delta Y_2$).

Having described the present invention with detail above, the invention is now summarized as analog-to-digital converter (e.g., converter 200) that comprises:

a first stage (e.g., 207 with integrator 210 and quantizer 220) to integrate and quantize the difference between a feedback signal (R) and an input signal (X) to a first intermediate signal ($Y_1$) with a first resolution ($M_1$);

a second stage (e.g., 208 with integrator 230 and quantizer 250) to integrate and quantize the first intermediate signal ($Y_1$) to a second intermediate signal ($Y_2$) with a second, lower resolution; and a feedback stage (e.g., DAC 260) to convert the second intermediate signal ($Y_2$) to the feedback signal (R); and a third stage (e.g., module 206 with differentiator 270, delay unit 280, adder 285) to differentiate the first intermediate signal ($Y_1$) to a third intermediate signal ($W_1$), to delay the second intermediate signal ($Y_2$) to a fourth intermediate signal ($W_2$), and to add the third and fourth intermediate signals ($W_1$, $W_2$) to an output signal (Y) having a resolution that results from the sum of the first ($M_1$) and second ($M_2$) resolutions.

While the invention has been described in terms of particular structures, devices and methods, those of skill in the art will understand based on the description herein that it is not limited merely to such examples and that the full scope of the invention is properly determined by the claims that follow.

What is claimed is:

1. A delta-sigma analog-to-digital converter that converts an analog input signal to a digital output signal, said converter comprising:
    a first quantizer to receive the integral of the difference between a feedback signal and said input signal and to provide a first intermediate digital signal having a first plurality of magnitude levels;
    a second quantizer to receive a modification of the integral of said first intermediate digital signal and to provide a second intermediate digital signal having a second plurality of magnitude levels; and
    a digital module to combine said first and second intermediate digital signals to said output signal, wherein said first and second pluralities of magnitude levels substantially add to each other.

2. The delta-sigma analog-to-digital converter of claim 1, wherein said first quantizer receives said integral from an analog integrator, and wherein in said digital module, a differentiator differentiates said first intermediate digital signal by a transfer function that is inverse to the transfer function of said analog integrator.

3. The delta-sigma analog-to-digital converter of claim 1, wherein said second quantizer receives said modification of the said integral of said first intermediate digital signal from an arrangement of a digital integrator in parallel to an amplifier.

4. The delta-sigma analog-to-digital converter of claim 1, wherein said first quantizer is implemented by a flash converter.

5. The delta-sigma analog-to-digital converter of claim 1, wherein said first quantizer has a bit resolution between 2 and 5.

6. The delta-sigma analog-to-digital converter of claim 1, wherein first and second signal ranges of said first and second quantizers represented by the differences between maximum and minimum values of said first and second intermediate digital signals, respectively, relate to each other proportionally, and wherein the number of steps of said first quantizer participates in a proportional factor between said first and second signal ranges.

7. The delta-sigma analog-to-digital converter of claim 6 wherein said first signal range is smaller than said second signal range.

8. The delta-sigma analog-to-digital converter of claim 1, wherein adjacent magnitude levels of said first intermediate signal are spaced by a first quantization step, wherein adjacent magnitude levels of said second intermediate signal are spaced by a second quantization step, and wherein said first and second quantization steps are different.

9. The delta delta-sigma analog-to-digital converter of claim 8, wherein said first quantization step is smaller than said second quantization step.

10. A method for converting an analog input signal to a digital output signal, said method comprising the following steps:
    quantizing a first integral of the difference between a feedback signal and said input signal to a first intermediate digital signal with a first plurality of magnitude levels;
    quantizing a second integral of said first intermediate digital signal to a second intermediate digital signal with a second plurality of magnitude levels; and
    combining said first and second intermediate digital signals to said output signal so that said first and second pluralities of magnitude levels substantially add to an overall plurality of magnitude levels of said output signal.

11. The method of claim 10, wherein said combining step comprises the following steps: differentiating the first intermediate signal to a third intermediate signal, delaying said second intermediate signal to a fourth intermediate signal, and adding said third and fourth intermediate signals to said digital output signal.

12. The method of claim 11, wherein in said differentiating step, said first intermediate digital signal is differentiated by a transfer function that is inverse to the transfer function by which said first integral is obtained in the quantizing step.

13. The method of claim 10, wherein in said first quantizing step, adjacent magnitude levels of said first intermediate signal are spaced by a first quantization step, wherein in said second quantizing step, adjacent magnitude levels of said second intermediate signal are spaced by a second quantization step that is different from said first quantization step.

14. The method of claim 13, wherein said first quantization step is smaller than said second quantization step.

15. An analog-to-digital converter, comprising:
    a first stage to integrate and quantize the difference between a feedback signal and an input signal to a first intermediate signal with a first resolution;
    a second stage to integrate and quantize said first intermediate signal to a second intermediate signal with a second, lower resolution;
    a feedback stage to convert said second intermediate signal to said feedback signal; and
    a third stage to differentiate said first intermediate signal to a third intermediate signal, to delay said second intermediate signal to a fourth intermediate signal, and to add said third and fourth intermediate signals to an output signal having a resolution that results from the sum of said first and second resolutions.

* * * * *